US006327633B1

United States Patent
Chawla et al.

(10) Patent No.: US 6,327,633 B1
(45) Date of Patent: Dec. 4, 2001

(54) SOLID STATE AUDIO SYSTEM

(75) Inventors: Deepak K. Chawla, Hazlet, NJ (US); Kevin Alan Shelby, Marietta, GA (US)

(73) Assignee: AT&T, New York, NY (US)

( * ) Notice: Subject to any disclaimer, the term of this patent is extended or adjusted under 35 U.S.C. 154(b) by 0 days.

(21) Appl. No.: 09/220,844

(22) Filed: Dec. 28, 1998

(51) Int. Cl.[7] .................................................. G06F 13/14
(52) U.S. Cl. ................................ 710/62; 369/2; 235/492; 235/486
(58) Field of Search .................. 710/62; 369/2; 235/492, 486

(56) References Cited

U.S. PATENT DOCUMENTS

| | | | | |
|---|---|---|---|---|
| 5,055,947 | * | 10/1991 | Satoh | 360/62 |
| 5,159,182 | * | 10/1992 | Eisele | 235/492 |
| 5,790,423 | * | 8/1998 | Lau et al. | 364/400.01 |
| 5,822,145 | * | 10/1998 | Nishida et al. | 360/69 |
| 6,039,260 | * | 3/2000 | Eisele | 235/492 |
| 6,061,306 | * | 5/2000 | Buchheim | 369/2 |
| 6,089,459 | * | 7/2000 | Eisele et al. | 235/492 |

* cited by examiner

Primary Examiner—Thomas Lee
Assistant Examiner—Abdelmoniem Elamin
(74) Attorney, Agent, or Firm—Kenyon & Kenyon

(57) ABSTRACT

A solid state audio system provides audio signals when played in an audio cassette player. The audio system is provided in a casing having the same size as a standard audio cassette tape and includes an audio tape, a sensing mechanism providing signals indicating a speed and a direction of travel of the audio tape, a processor coupled to the sensing mechanism and a memory card coupled to the processor and storing digitized audio information. The audio system also includes an audio transfer system coupled to the processor and magnetically coupled to the audio tape for transferring audio signals onto the tape corresponding to the digitized audio information. A solid state audio player is also provided that includes a memory card having digitized audio information stored thereon, a processor coupled to the memory card, a D/A converter coupled to the memory card and the processor. The D/A converter outputs an analog audio signal. The player also includes a plurality of control inputs, the control inputs are selectable for placing the audio player in one of several states. A selected portion of the digitized audio information is output to the D/A converter in response to the state of the player.

25 Claims, 4 Drawing Sheets

SOLID STATE AUDIO SYSTEM

BACKGROUND OF THE INVENTION

The present invention relates to the field of cassette tape players, and more particularly, to solid state cassette tape players.

Current audio cassette tapes allow prerecorded audio information to be replayed using a standard audio cassette tape player. Standard cassette tape players are used in automobiles, home stereo systems, etc. Due to physical space limitations, however, standard audio tapes can only store and play approximately 60–90 minutes of audio information. In contrast, computer memories can store large amounts of digital information and can be easily reprogrammed or updated with new information. In addition, standard magnetic audio tapes are subject to distortion due to unwanted magnetization of the audio tape. Moreover, current audio cassette tape systems or stereos do not allow for high capacity memories to provide recorded audio or music information.

As a result, there is a need for an improved cassette tape or audio system that allows music or audio information stored on a computer memory to be played or output on standard audio cassette tape players. In addition, there is a need for a tape player that can store and output audio signals without using magnetic recording media.

SUMMARY OF THE INVENTION

A solid state audio system is provided which addresses some of the drawbacks of the prior art. The solid state audio system is provided in a casing that is approximately the same size as a standard audio cassette tape. The audio system provides or outputs audio signals when played in an audio cassette player, and includes an audio tape, a sensing mechanism providing signals indicating a speed and a direction of travel of the audio tape, a processor coupled to the sensing mechanism and a memory card coupled to the processor and storing digitized audio information. The audio system also includes an audio transfer (or recording) system coupled to the processor and magnetically coupled to the audio tape for transferring audio signals onto the tape corresponding to the digitized audio information in response to signals from the processor. According to an embodiment of the present invention, digitized audio information is played using an audio cassette player, and includes the steps of storing digitized audio information in a memory, detecting a state of the cassette player, calculating an updated memory location based on the detected state of the cassette player and transferring the digitized audio information beginning from the updated memory location onto an audio tape to be played on the audio cassette player.

According to another embodiment of the present invention, a solid state audio player is provided that includes a memory card having digitized audio information stored thereon, a processor coupled to the memory card, a D/A converter coupled to the memory card and the processor. The D/A converter outputs an analog audio signal. The player also includes a plurality of control inputs, the control inputs selectable for placing the audio player in one of several states and a control circuit coupled to the control inputs and outputting a signal to the processor corresponding to a selected one of the control inputs. The processor causes a selected portion of the digitized audio information to be output to the D/A converter in response to the signal received from the control circuit.

DETAILED DESCRIPTION

Figure 1:
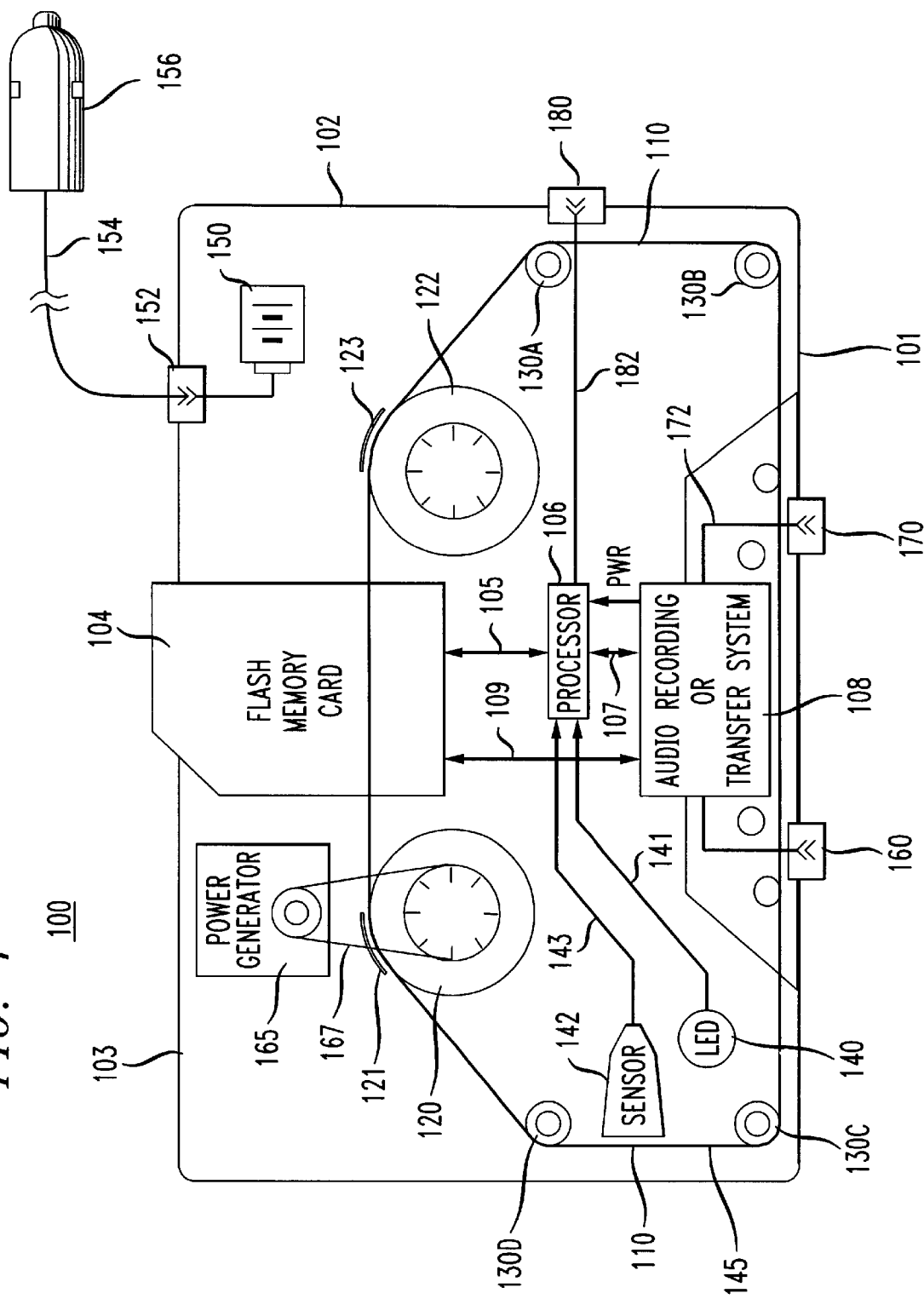
FIG. 1 is a block diagram illustrating an solid state audio system according to an embodiment of the present invention.

Referring to the drawings in detail, wherein like numerals indicate like elements, FIG. 1 is a block diagram illustrating an solid state audio system according to an embodiment of the present invention. Audio system 100 plays music in an audio cassette tape player, such as the cassette tape players found in automobiles or in home stereo systems (either analog players or digital cassette tape players).

Solid state audio system 100 includes a casing 102 which is preferably approximately the same size as a standard audio cassette tape. The casing 100 has an audio tape 110 exposed along a front side 101. Casing 100 also includes a back side 103. Audio tape 110 travels in an oval path across outer guides 121 and 123 of gears 120 and 122, respectively. Tape 110 also travels across guides 130A, 130B, 130C and 130D.

System 100 also includes a memory card, such as a flash memory card 104 or the like for storing digitized music or other audio information. Flash memory card 104 is removable from system 100. As a result, flash memory card can be removed to allow new digitized audio information to be reprogrammed or stored thereon, or to insert a new flash memory card. The digitized audio information stored on memory card 104 may be in a compressed format using standard data compression techniques. A processor 106 is coupled to flash memory card 104 via line 105 for controlling the overall operation of the system 100. Line 105 may include data, address and control buses, for example. In the event the audio information stored on card 104 is compressed, processor 106 can operate to decompress the information. An audio transfer (or recording) system 108 is coupled to processor 106 via line 107 for transferring the audio signals stored in memory card 104 onto tape 110 (e.g., for magnetically recording audio signals onto the audio tape 110). Also, flash memory card 104 is coupled directly to audio recording system 108 via line 109.

System 100 includes a connector 170 connected to audio recording system 108 via line 172 for directly outputting analog audio signals. For example, these analog audio signals can be used to drive speakers or headphones of a "Walkman" type stereo system. System 100 also includes a connector 180 for directly receiving play control signals (explained in greater detail in connection with FIG. 3).

System 100 includes a sensing mechanism for sensing the direction and speed of rotation or travel of tape 110. According to an embodiment of the present invention, the sensing mechanism is an optical sensing mechanism, and includes a light emitting diode (LED) and a sensor 142. LED 140 and sensor 142 are coupled to processor 106 via lines 141 and 143, respectively. According to this embodiment, tape 110 includes a pattern (such as an optical pattern provided on a reflective strip) on tape 110. In operation of the optical sensing mechanism, LED 140 emits a light that is reflected from optical pattern. Optical sensor generates and provides an electrical signal to processor 106 via line 143 based on the reflected light from the pattern on tape 110. This electrical signal provides processor 106 with information describing the direction and speed of rotation or travel of tape 110.

Other sensing mechanisms can be used to sense the speed and direction of rotation of tape 110. For example, a mechanical sensing mechanism can be connected to one of gears 120 or 122. An electrical signal can be generated based on the speed and rotation speed of either gear 120 or 122. This electrical signal can be provided to processor 106.

System 100 includes one or more power sources. One such power source includes a battery 150 for providing electrical power. Another power source includes a connector 152 for receiving a cord 154 and connector 156 which plugs into, for example, a cigarette lighter outlet in an automobile. Both connector 152 and battery 150 are connected to provide electrical power to all components of system 100. Thus, DC power can be provided from a cigarette lighter outlet (or other D.C. power source) to system 100 via connector 152. Connector 152 can be provided on the back side 103 so that when system 100 is inserted into an automobile cassette player, the power cord 154 may extend out of an entry door of the automobile cassette player. Alternatively, a DC power connector 160 is provided on the front side 101 for receiving a DC power supply.

As an additional or alternative technique, a power generator 165 can be provided for generating power. A belt 167 is connected between power generator 165 and gear 120 so that rotation of gear 120 (driven by the standard audio cassette player not shown) causes power generator 165 to provide DC electrical power for system 100.

Figure 2:
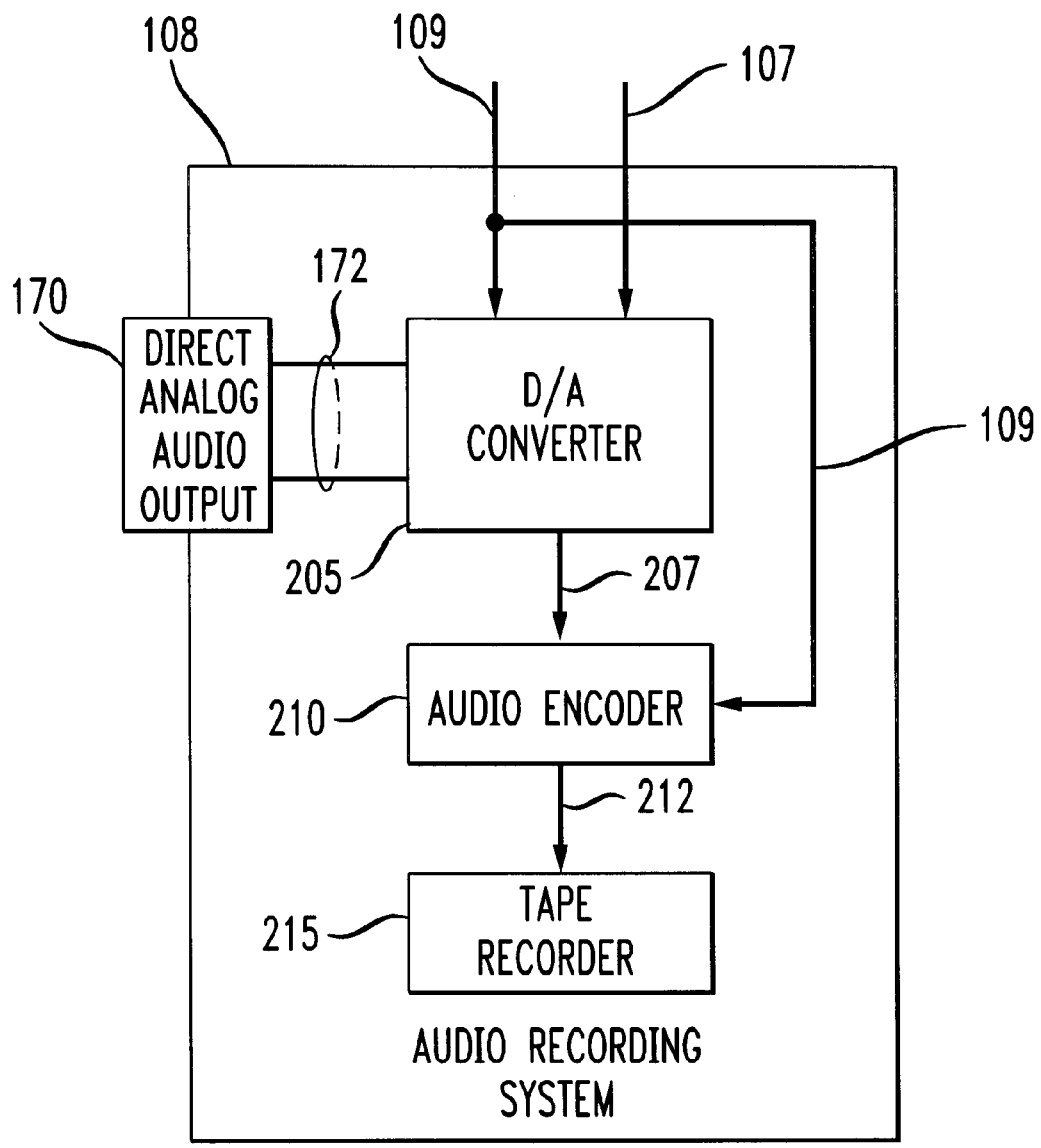
FIG. 2 is a block diagram illustrating a audio recording system according to an embodiment of the present invention.

FIG. 2 is a block diagram illustrating the audio recording system 108 according to an embodiment of the present invention. Audio recording system 108 includes a digital-to-analog (D/A) converter for converting digital (or digitized) audio signals received via line 109 or 107 to an analog format.

An audio encoder 210 is also coupled via line 207 to D/A converter 205 (to receive analog audio signals) and is also coupled to flash memory card 104 via line 109 (to receive the digitized audio signals). Audio encoder 210 encodes the audio information into a format that can be recorded or stored on tape 110. For example, the analog information can be encoded as either an analog signal (as in a standard analog audio cassette player) or as a digital signal (such as for digital audio tape, or DAT player). In the case of a standard analog audio signal, audio encoder 210 may not be necessary.

Audio recording system 108 also includes a tape recorder 215 which is coupled via line 212 to audio encoder 210. In the event that tape 110 is a magnetic tape, tape recorder 215 can be a conventional magnetic tape recorder and when operative, will be magnetically coupled to tape 110 for recording the audio information onto tape 110.

In operation, music or other audio information is digitized and stored on flash memory card 104. The audio information stored on memory card 104 may include, for example, several songs or other audio information. The system 100 is inserted into a standard audio cassette player (such as in an automobile or home stereo). The user then uses the standard control buttons, such as play, fast forward, reverse, search (for next song), etc. to control playing and selection of the music on tape 110. Gears 120 and 122 engage with rotating pins driven by the standard audio cassette player (under control of the control buttons).

When the standard audio cassette player is in the play position, the sensing mechanism provides an electrical signal to processor 106 via line 143. Based on this electrical signal, processor 106 detects that the tape 110 is being driven forward at the standard (play) speed. In response to being driven at the standard forward speed (used when the tape is being played), system 100 operates to output and record the audio information onto tape 110 so that the music stored in flash memory card 104 will be output by the speakers connected to the standard audio cassette player (e.g., output by either the automobile or home speakers). The digitized audio is converted to an analog format by D/A converter 205, is encoded by encoder 210 (if necessary) and magnetically recorded by tape recorder 215 onto tape 110. The recorded audio information is then detected and output by the standard audio cassette player as music. The tape continues rotating along guides 130A–D. Flash memory card 104 may include many hours of digitized audio information or music (much more than stored on a conventional audio tape). Tape 110 has a finite length, and may include enough tape for only a few (e.g., five) seconds of audio information. As a result, recorder 215 will record over previously recorded audio signals.

The user may then press the other control buttons. For example, in response to selection of the reverse control button, the tape 110 then stops and begins moving in the reverse direction. Based on signals from the sensing mechanism, processor detects that the standard audio cassette tape player is now in reverse (based on the tape 110 traveling in the reverse direction). In response to detecting the reverse operation, system 100 inhibits audio recording system (tape recording is not performed while tape 10 is in reverse). When the user presses stop and the tape stops rotating, the processor 106 calculates the corresponding updated memory address (e.g., a previous memory address in flash memory card 104) based on the distance that tape 110 rotated (or based on the speed and the time which the tape was in reverse, etc.). When the user presses play, processor 106 activates audio recording system 108 to continue encoding and recording the audio information onto tape 110 beginning at the corresponding updated address.

Similarly, when the user selects or depresses the fast forward control button, the processor 106 detects that the direction of the tape 110 is forward and the speed of the tape 110 is greater than a threshold speed. (A forward direction and a speed less than the threshold speed indicates the tape is in the playing state). In response to detecting the fast forward state, the processor 106 inhibits audio recording system 108. When the tape 110 stops moving, processor 106 similarly calculates an updated address in memory based on the distance of tape rotation (or time of rotation). When the user presses play (detected by a forward rotation of tape 110 at a speed less than the threshold speed), processor 106 activates audio recording system 108 to continue encoding and recording audio information onto tape 110.

Figure 3:
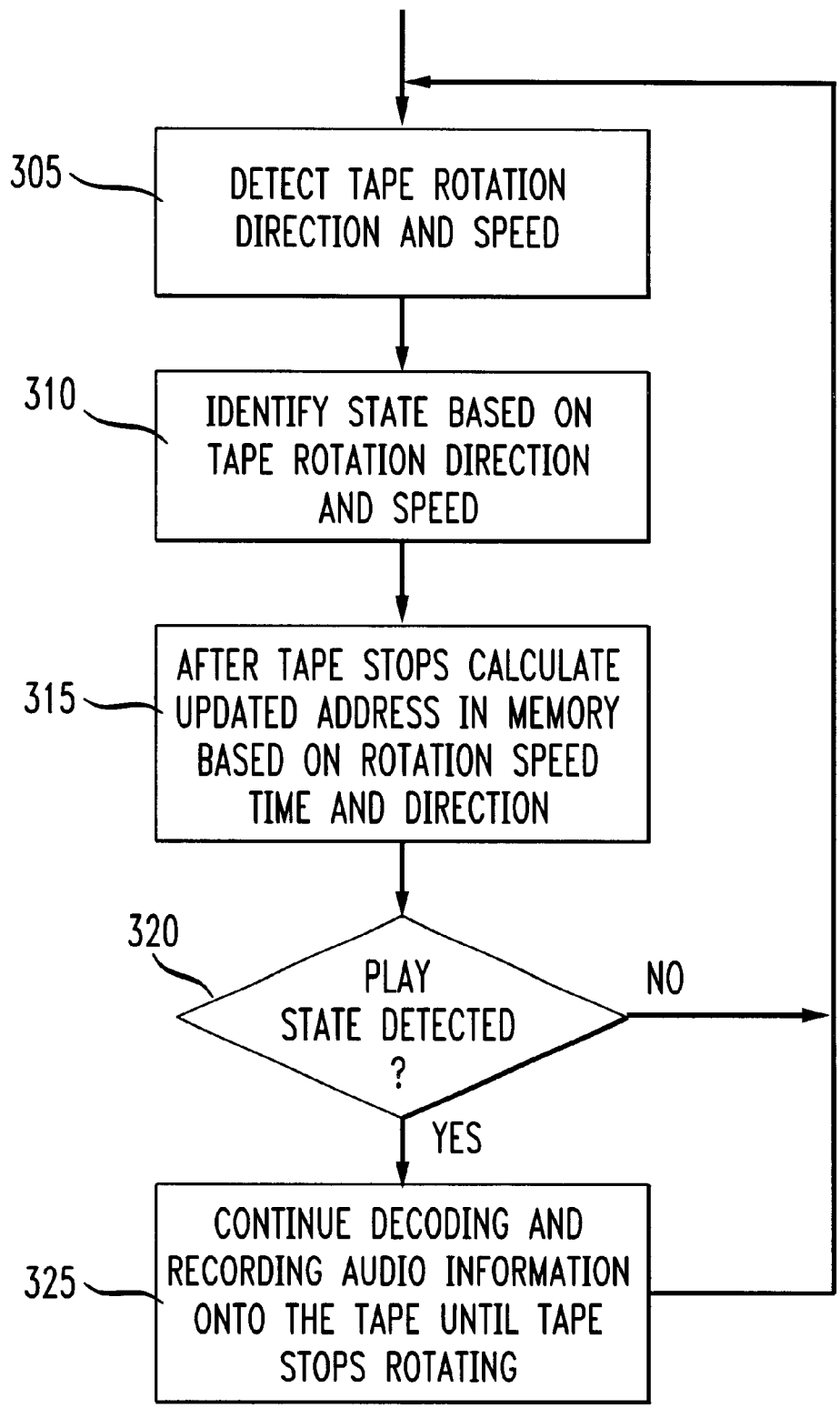
FIG. 3 is a flow chart illustrating operation of the solid state audio system illustrated in FIG. 1 according to an embodiment of the present invention.

FIG. 3 is a flow chart illustrating operation of the system 100 according to an embodiment of the present invention.

In step 305, processor 106 detects the rotation direction and speed of tape 110 (based on signals from the sensing mechanism). At step 310, processor 106 identifies the state of the player (stop, play, fast forward, reverse, etc.) based on the speed and direction of tape 110. At step 315, after tape 110 stops rotating, processor 106 calculates an updated address corresponding to the new tape location (e.g., based on tape speed and time of rotation and direction). At step 320, processor 106 detects the speed and rotation direction of tape 110. If these measurements indicate a play state, the flow proceeds to step 325. Otherwise flow returns to step 305. At step 325, based on control signals from the processor 106, audio recording system 108 continues encoding and recording the audio information stored in flash memory card 104 onto tape 110 beginning at the updated memory address.

Figure 4:
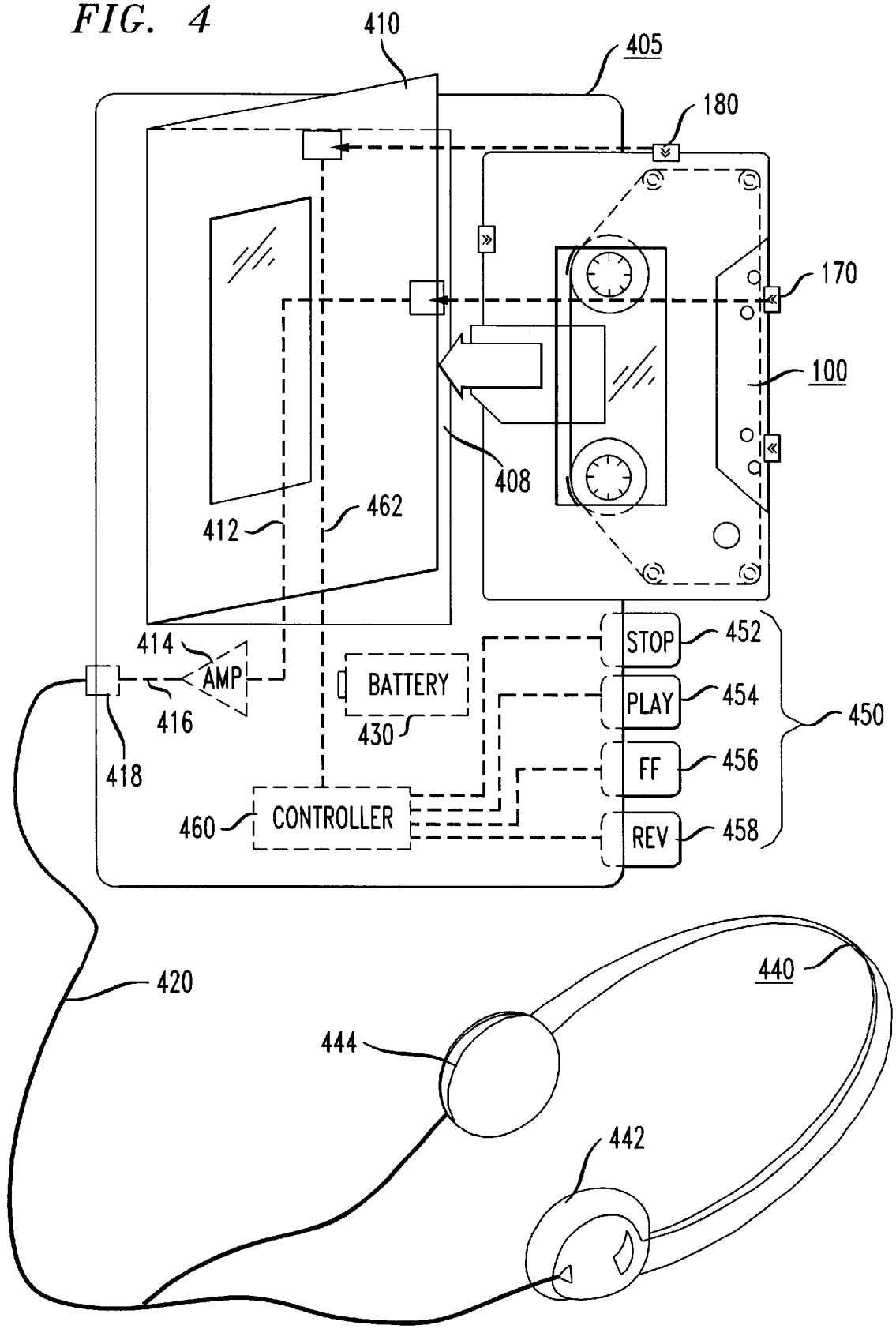
FIG. 4 is a block diagram illustrating another embodiment of the present invention.

FIG. 4 is a block diagram illustrating another embodiment of the present invention. A portable audio cassette player (portable player) 405 is provided for playing audio information stored on flash memory card 104 without encoding and recording the audio information onto the tape 110. The portable player includes a slot 408 for receiving the solid state audio system 100 and a battery 430 for providing power to all components of the system. Several control buttons 450 (or control inputs), including a stop button 452, a play button 454, a fast forward button 456 and a reverse button 458, and the like, are provided for selecting the state of operation of audio system 100 and portable player 405. Once audio system 100 is inserted into slot 408, a lid 410 can be closed to secure the audio system 100 within player 405.

As shown in FIGS. 1 and 4, audio system 100 includes a connector 170 which provides a direct analog audio signal output from D/A converter 205 (FIG. 2). When audio system 100 is inserted in portable player 405, the analog signal directly output from connector 170 is coupled via line 412 to an amplifier 414. Amplifier 414 outputs an amplified analog audio signal onto line 416. A pair of headphones 440, including speakers 442 and 444, can be plugged in via cord or line 420 to a connector 418 of player 405. Thus, headphones 440 receive the amplified analog audio signal output from amplifier 414. The speakers 442 and 444 generate music or other sounds based upon the amplified audio signals output from amplifier 414. Therefore, using portable player 405, the digitized music or audio stored on memory card 104 can be played on headphones 440 without a rotating tape, or without the need to encode or record the audio information. (Thus, encoding and recording are inhibited).

A controller 460 is coupled to each of the control inputs 450. Controller outputs a play control signal via line 462 based on the selection or depression of one of the control inputs 450. As shown in FIGS. 1 and 4, audio system includes a connector 180 for receiving play control signals via line 462. The play control signals provided on line 462 indicate whether the portable player is in the stop, play, fast forward or reverse state. These play control signals are input directly to the processor 106 via connector 180 and line 182 (FIG. 1). Therefore, instead of detecting the rotation direction and speed of tape 110, the processor 106 directly receives a play control signal based on the selection of control inputs 450, when audio system is inserted in portable player 405.

In operation of portable player 405, the user selects or depresses one of control inputs 450. The processor 106 receives the corresponding play control signal (which identifies the state of the player 405). Processor then selects the appropriate address or location in memory (of memory card 104). When in the play state, D/A converter 205 of recording system 108 outputs an analog audio signal based on the digitized audio information stored in flash memory card 104. In response to a fast forward or a reverse control signal (provided via line 462), processor 106 calculates a corresponding updated address or location in memory based on the period or length of time the control input is selected (or depressed). In this manner, the portable player can, in effect, stop, play, fast forward or reverse the solid state audio system 100 substantially without any moving parts (e.g., no rotating tapes or gears). Portable player also avoids any distortion which may result from the encoding and recording of the audio information onto tape 110. Thus, portable player may provide a higher quality audio output than provided by standard audio cassette tape players.

Several embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A solid state audio system for providing audio signals when played in an audio cassette player, the audio system comprising:

an audio tape;

a sensing mechanism providing signals indicating a speed and a direction of travel of the audio tape;

a processor coupled to the sensing mechanism;

a memory card coupled to the processor and storing digitized audio information; and an audio transfer system coupled to the processor and magnetically coupled to the audio tape for transferring audio signals onto the tape corresponding to digitized audio information from said memory card selected by said processor in response to signals from said sensing mechanism.

2. The audio system of claim 1 wherein said audio transfer system comprises an audio recording system.

3. The audio system of claim 2 wherein said sensing mechanism comprises an optical sensing mechanism.

4. The audio sensing mechanism of claim 3 wherein said optical sensing mechanism comprises a pattern provided on the audio tape, a LED, and an optical sensor.

5. The audio system of claim 1 wherein said memory card comprises a flash memory card.

6. The audio system of claim 1 and further comprising a battery coupled to the processor, the memory card and the audio transfer system.

7. The audio system of claim 1 wherein said transfer system comprises:

a D/A converter;

an audio encoder coupled to the D/A converter; and a tape recorder.

8. The audio system of claim 1 and further comprising a power generator.

9. The audio system of claim 1 and further comprising a connector for receiving a DC power supply.

10. The solid state audio system of claim 1 wherein the audio signals transferred onto the tape are analog audio signals.

11. A method of playing digitized audio information on an audio cassette player, comprising the steps of:

storing digitized audio information in a memory;

detecting a state of the cassette player;

calculating an updated memory location based on the detected state of the cassette player;

transferring the audio information beginning from the updated memory location onto an audio tape to be played on the audio cassette player.

12. The method of claim 11 wherein said step of detecting comprises the steps of detecting at least one of a speed and a direction of travel of the audio tape.

13. The method of claim 11 wherein said step of detecting comprises the step of detecting at least one of a stop, play, fast forward and reverse states based on at least one of a speed and a direction of travel of the audio tape.

14. The method of claim 11 wherein said step of calculating an updated memory location comprises the step of calculating an updated memory location based on a period of time the cassette player is in one of the detected states.

15. The method of claim 13 wherein said step of calculating an updated memory location comprises the step of calculating an updated memory location based on a speed and a direction of travel and a length of time.

16. The method of claim 15 wherein said step of calculating an updated memory location comprises the step of calculating an updated memory location based on a length the audio tape has traveled.

17. The method of claim 11 wherein said step of calculating comprises the step of calculating an updated memory location after the player is in a stopped state.

18. The method of claim 11 and further comprising the step of converting the digitized audio information to an analog audio information.

19. The method of claim 18 wherein said step of transferring comprises the step of recording the analog audio information onto the tape based on the digitized audio information stored beginning from the updated memory location.

20. The method of claim 11 wherein said step of transferring comprises the step of recording the digitized audio information in a digital format onto an audio tape beginning from the updated memory location.

21. The method of claim 11 wherein the audio information is transferred onto the audio tape in analog form.

22. A solid state audio player comprising:
   a memory card having digitized audio information stored thereon;
   a processor coupled to the memory card;
   a D/A converter coupled to the memory card and the processor, the D/A converter outputting an analog audio signal;
   a plurality of control inputs, the control inputs selectable for placing the audio player in one of several states;
   a control circuit coupled to the control inputs and outputting a signal to the processor corresponding to a selected one of the control inputs;
   the processor causing a selected portion of the digitized audio information to be output to the D/A converter in response to the signal received from the control circuit.

23. The solid state audio player of claim 22 and further comprising an amplifier coupled to the D/A converter and outputting an amplified audio signal.

24. The solid state audio player of claim 22 and further comprising one or more speakers coupled to an output of the D/A converter.

25. The solid state audio player of claim 22 wherein the control inputs comprise one or more of a stop input, a play input, a fast forward input and a reverse input.

* * * * *